United States Patent
Hajicek et al.

(10) Patent No.: US 6,377,462 B1
(45) Date of Patent: Apr. 23, 2002

(54) CIRCUIT BOARD ASSEMBLY WITH HEAT SINKING

(75) Inventors: Michael A. Hajicek; Jon Thomas Jacobson, both of Fargo, ND (US); Mark Jones, Watertown, SD (US); Kevin Lee Brekkestran, Fargo, ND (US)

(73) Assignee: Deere & Company, Moline, IL (US)

( * ) Notice: Subject to any disclaimer, the term of this patent is extended or adjusted under 35 U.S.C. 154(b) by 0 days.

(21) Appl. No.: 09/757,211

(22) Filed: Jan. 9, 2001

(51) Int. Cl.[7] .................................................. H05K 7/20
(52) U.S. Cl. ...................... 361/719; 361/704; 361/717; 361/718; 361/720; 174/16.3; 174/252; 165/80.2; 165/185
(58) Field of Search ................................. 361/704, 707, 361/713, 717, 718, 719, 720, 760; 174/16.1, 16.3, 52.1, 250, 252; 165/80.2, 80.3, 185

(56) References Cited

U.S. PATENT DOCUMENTS

| | | | |
|---|---|---|---|
| 3,328,642 A | 6/1967 | Haumesser et al. | 317/100 |
| 3,356,904 A | 12/1967 | Yonkers | 317/100 |
| 3,487,267 A | 12/1969 | Winston et al. | 317/100 |
| 3,621,337 A | 11/1971 | Kappenhagen | 317/100 |
| 3,885,304 A | 5/1975 | Kaiser | 29/627 |
| 3,919,602 A | 11/1975 | Kaiser et al. | 317/101 |
| 4,047,242 A | 9/1977 | Jakob et al. | 361/389 |
| 4,204,247 A | 5/1980 | Wigley | 361/387 |
| 4,339,260 A | 7/1982 | Johnson et al. | 65/160 |
| 4,475,445 A | 10/1984 | Dietzsch et al. | 98/2.05 |
| 4,811,165 A | 3/1989 | Currier et al. | 361/386 |
| 4,823,235 A | 4/1989 | Suzuki et al. | 361/424 |
| 4,853,828 A | 8/1989 | Penn | 361/386 |
| 4,941,067 A | 7/1990 | Craft | 361/386 |
| 4,945,451 A | 7/1990 | Gohl et al. | 361/386 |
| 5,019,941 A | 5/1991 | Craft | 361/386 |
| 5,086,509 A | 2/1992 | Inubushi et al. | 455/89 |
| 5,118,903 A | 6/1992 | Schupp et al. | 174/16.3 |
| 5,179,366 A | 1/1993 | Wagner | 338/313 |
| 5,191,512 A | 3/1993 | Ogura et al. | 361/386 |
| 5,218,215 A | 6/1993 | Liang et al. | 257/712 |
| 5,339,519 A | * 8/1994 | Fortune | 29/840 |
| 5,467,251 A | 11/1995 | Katchmar | 361/719 |
| 5,468,909 A | * 11/1995 | Schonberger et al. | 174/16.1 |
| 5,526,229 A | 6/1996 | Wakabayashi et al. | 361/702 |
| 5,615,087 A | 3/1997 | Wieloch | 361/719 |
| 5,708,566 A | * 1/1998 | Hunninghaus et al. | 361/764 |
| 6,046,906 A | 4/2000 | Tseng | 361/704 |
| 6,222,732 B1 | * 4/2001 | Jakob et al. | 361/704 |

FOREIGN PATENT DOCUMENTS

| | | |
|---|---|---|
| DE | 2 214 163 | 10/1973 |
| DE | 2 226 395 | 12/1973 |
| DE | 81 P 2052 | 11/1982 |
| DE | 31 15017 A1 | 11/1982 |
| DE | 33 05 167 A1 | 8/1984 |
| DE | 34 37 774 A1 | 4/1986 |
| DE | 38 32 856 A1 | 3/1990 |
| FR | 2 223 933 | 10/1974 |
| JP | 405259370 A | * 10/1993 ................. 361/719 |

OTHER PUBLICATIONS

GMA–Heft; date Nov. 11, 1982.
IBM Technical Disclosure Bullentin "Heat Sink Assembly for Tab–Mounted Devices", date Nov. 1988.

* cited by examiner

Primary Examiner—Leo P. Picard
Assistant Examiner—Boris L. Chervinsky

(57) ABSTRACT

A circuit assembly includes a printed circuit board which has a plurality of copper traces formed thereon. Heat generating electronic components are surface mounted on the board in contact with parts of the traces. A heat conducting copper plate is mounted on the board adjacent to and spaced apart from the electronic components, and in contact with other parts of the traces. A silicon pad is mounted on the plate, and a heat sink member is mounted on the pad so that the pad is between the heat sink member and the traces. Heat conducting solder bridges are formed between the edges of the electronic components and the edges of the plate.

8 Claims, 1 Drawing Sheet

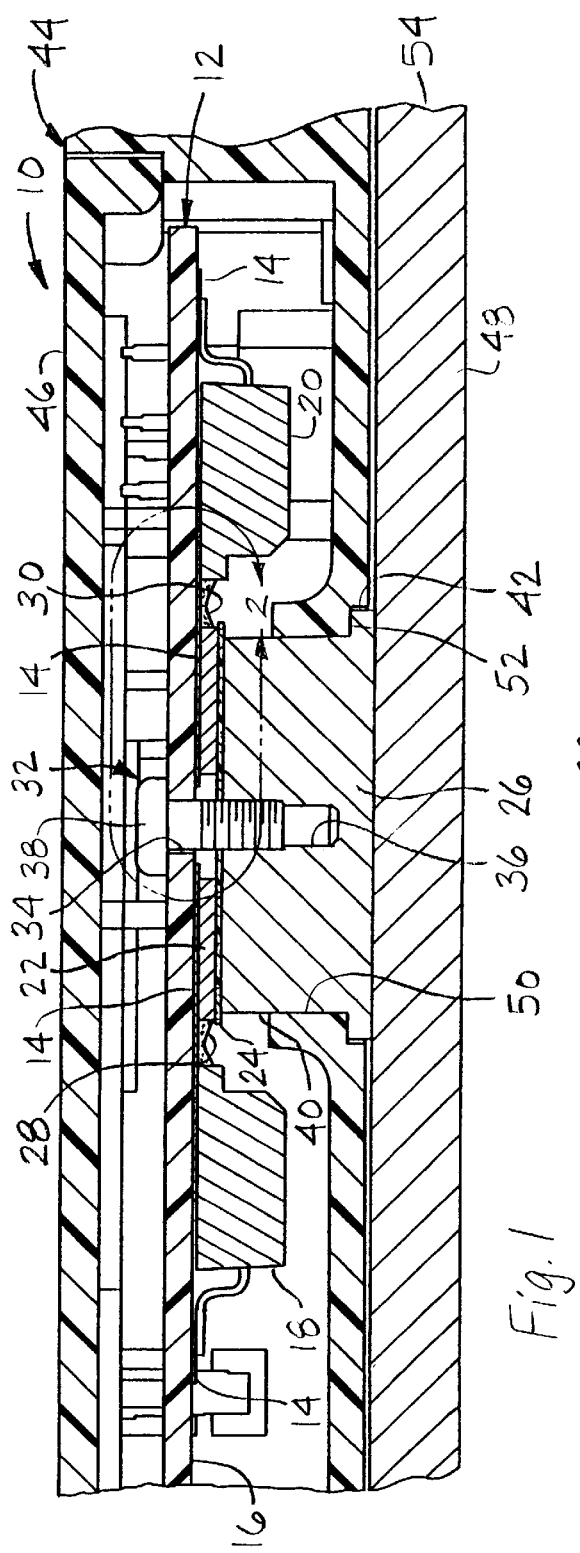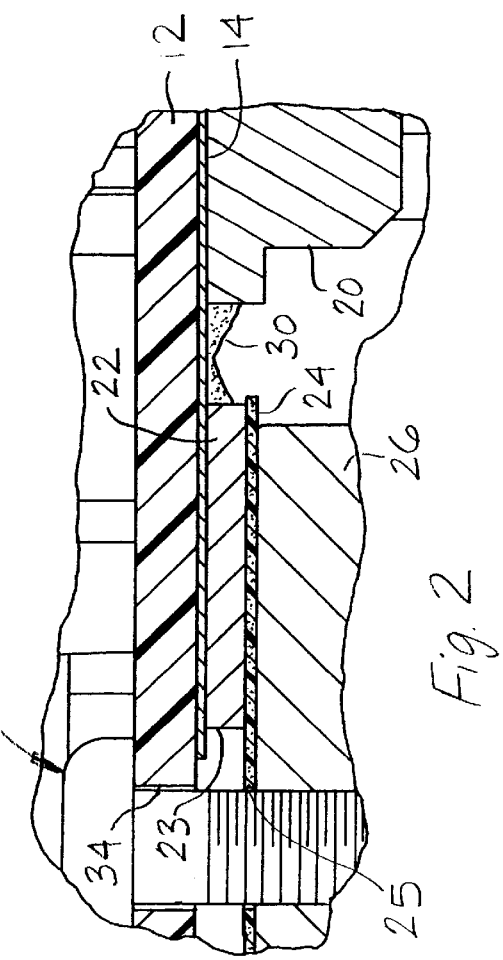

CIRCUIT BOARD ASSEMBLY WITH HEAT SINKING

BACKGROUND OF THE INVENTION

This invention relates to a printed circuit board assembly with improved heat sinking.

It is often necessary to dissipate heat from electronic components which are mounted on printed circuit boards (PCB). Conventionally, this has been accomplished by providing a heat sink between the electronic component and the PCB. This has also been accomplished by providing a heat sink directly on top of the electronic component. However, such assemblies are expensive to manufacture.

It is known to enclose or "package" relatively high power surface mount (SMT) components using a package style known as "D-squared package" (DDPAK), wherein a component's package is basically the outside plastic enclosure and leads. The electronics industry refers to such an assembly as a package, because the actual silicon is inside the enclosure. If a circuit assembly includes multiple DDPAK SMT components, then the normal DDPAK "footprints" may not provide sufficient heat transfer away from the components. This problem is aggravated when the circuit board is enclosed in a plastic case rather than metal enclosure. Accordingly, a heat sinking assembly which overcomes these problems is desired.

SUMMARY OF THE INVENTION

Accordingly, an object of this invention is to provide an efficient heat sink arrangement for surface mounted electronic components.

This and other objects are achieved by the present invention, wherein a circuit assembly includes a printed circuit board with metallic traces formed thereon, and heat generating electronic components surface mounted on the board in contact with a part of the traces. A heat conducting metal plate is mounted on the board adjacent to and spaced apart from the electronic component. The plate contacts a second part of the traces. A heat conducting, electrically insulating pad is mounted on the plate, and a heat sink member is mounted on the pad so that the pad is between the heat sink member and the traces. A heat conducting metallic (solder) bridge is formed between an edge of the electronic component and an edge of the plate.

BRIEF DESCRIPTION OF THE DRAWINGS

FIG. 1 is a sectional view of a circuit board assembly according to the present invention; and FIG. 2 is an enlarged view of a portion of FIG. 1.

DETAILED DESCRIPTION

A circuit assembly 10 includes a printed circuit board 12 which has a plurality of metallic, preferably copper, traces 14 formed on a surface 16 thereof. Heat generating electronic components 18 and 20 are preferably surface mounted on the board 12 so that they engage parts of the traces 14. A heat conducting metal plate 22, preferably copper plated with a solder adhering plating, is mounted on the board 12 adjacent to and spaced apart from the electronic components 18 and 20 so that the plate 22 engages a second part of the traces 14. The plate 22 has a central opening 23.

A heat conducting, electrically insulating pad 24, such as a commercially available silicon pad or "sil-pad" is mounted on the plate 22 and has a central opening 25. A heat sink member 26, made of a heat absorbing and conducting metal, such a zinc, is mounted on the pad 24 so that the pad 24 is between the heat sink member 26 and the second part of the traces 14. Heat conducting solder bridges 28 and 30 are formed between the edges of the electronic component 18 and 20 and the edges of the plate 22. The heat sink member 26 is preferably attached to the board 12 by a screw 32 which extends through a bore 34 in the board 12, through openings 23 and 25, and is threaded into a bore 36 in the member 26 and which has a head 38 which engages the plate 12. Heat sink member 26 is preferably cylindrical and includes a body 40 and a flange 42.

This entire assembly is enclosed within a housing 44 which is preferably plastic, and which includes housing parts 46 and 48. Housing part 48 has a stepped bore 50 formed therein which receives the heat sink member 26, and the bore 50 forms an annular shoulder 52 which engages the flange 42 of the heat sink member 26. The assembly 10 is supported by a mounting bracket 54.

With this assembly, heat is conducted away from the components 18 and 20 to the heat sink member 26 via the traces 14 and via the solder bridges 28 and 30.

While the present invention has been described in conjunction with a specific. embodiment, it is understood that many alternatives, modifications and variations will be apparent to those skilled in the art in light of the foregoing description. Accordingly, this invention is intended to embrace all such alternatives, modifications and variations which fall within the spirit and scope of the appended claims.

What is claimed is:

1. A circuit assembly, comprising:
   a printed circuit board having metallic traces formed on a surface thereof;
   a heat generating electronic component surface mounted on said board and engaging a first part of said metallic traces;
   a heat conducting metal plate mounted on the board adjacent to and spaced apart from the electronic component, and engaging a second part of the traces; the electronic component and the metal plate are disposed on the same side of the printed circuit board;
   a heat conducting, electrically insulating pad mounted on the plate;
   a heat sink member mounted on the pad so that the pad is between the heat sink member and said second part of the traces; and
   a heat conducting metallic bridge between an edge of the electronic component and an edge of the plate.

2. The circuit assembly of claim 1, wherein:
   the heat sink member is attached to the board by a screw which extends through a bore in the board and which is threaded into a bore formed in the heat sink member.

3. The circuit assembly of claim 1, further comprising:
   a housing which encloses the circuit assembly, the housing having an opening therein which receives the heat sink member.

4. The circuit assembly of claim 1, wherein: the bridge is formed out of solder.

5. In a circuit assembly having a printed circuit board with metallic traces formed thereon and a heat generating electronic component surface mounted on the board in contact with the metallic traces, a heat transfer arrangement comprising:
   a heat conducting metal plate mounted on the board adjacent to and spaced apart from the electronic component, and engaging part of the traces; the electronic component and the metal plate are disposed on the same side of the printed circuit board;

a heat conducting, electrically insulating pad mounted on the plate;

a heat sink member mounted on the pad so that the pad is between the heat sink member and said metal plate; and a heat conducting metallic bridge extending between an edge of the electronic component and an edge of the plate.

6. The heat transfer arrangement of claim 5, wherein:
the heat sink member is attached to the board by a screw which extends through a bore in the board and which is threaded into a bore formed in the heat sink member.

7. The heat transfer arrangement of claim 5, further comprising:
a housing which encloses the circuit assembly, the housing having an opening therein which receives the heat sink member.

8. The heat transfer arrangement of claim 5, wherein:
the bridge is formed out of solder.

\* \* \* \* \*